(12) United States Patent
Meyer et al.

(10) Patent No.: US 8,058,731 B2
(45) Date of Patent: Nov. 15, 2011

(54) TECHNIQUE FOR FORMING METAL LINES IN A SEMICONDUCTOR BY ADAPTING THE TEMPERATURE DEPENDENCE OF THE LINE RESISTANCE

(75) Inventors: Moritz Andreas Meyer, Dresden (DE); Matthias Lehr, Dresden (DE); Eckhard Langer, Radebeul (DE)

(73) Assignee: Advanced Micro Devices, Inc, Austin, TX (US)

( * ) Notice: Subject to any disclaimer, the term of this patent is extended or adjusted under 35 U.S.C. 154(b) by 776 days.

(21) Appl. No.: 11/952,522

(22) Filed: Dec. 7, 2007

(65) Prior Publication Data

US 2008/0268265 A1    Oct. 30, 2008

(30) Foreign Application Priority Data

Apr. 30, 2007   (DE) .......................... 10 2007 020 252

(51) Int. Cl.
    *H01L 23/48*    (2006.01)
    *H01L 23/52*    (2006.01)
(52) U.S. Cl. .................. 257/762; 257/751; 257/752
(58) Field of Classification Search ............... 257/762, 257/E23.161, 751, 752, 753
See application file for complete search history.

(56) References Cited

U.S. PATENT DOCUMENTS 5,077,005 A * 12/1991 Kato ........................... 420/469
6,117,770 A *  9/2000 Pramanick et al. .......... 438/659

FOREIGN PATENT DOCUMENTS

EP    1 376 680 A1    1/2004
WO  WO 02/099874 A2  12/2002

OTHER PUBLICATIONS

Foreign associate transmittal letter dated Jan. 15, 2008.
Translation of Official Communication issued Nov. 13, 2007.
Glasow, A von, Fischer A.H., Steinlesberger, G., "Using the Temperature Coefficient of the Resistance (TCR) as Early Reliability Indicator for Stressvoiding Risks in CU Interconnects" IEEE 03CH37400. 41st Annual International Reliability Physics Symposium, Dallas, TX 2003.

* cited by examiner

*Primary Examiner* — Hung Vu
(74) *Attorney, Agent, or Firm* — Williams, Morgan & Amerson

(57) ABSTRACT

By moderately introducing defects into a highly conductive material, such as copper, the resistance versus temperature behavior may be significantly modified so that enhanced electromigration behavior and/or electrical performance may be obtained in metallization structures of advanced semiconductor devices. The defect-related portion of the resistance may be moderately increased so as to change the slope of the resistance versus temperature curve, thereby allowing the incorporation of impurity atoms for enhancing the electromigration endurance while not unduly increasing the overall resistance at the operating temperature or even reducing the corresponding resistance at the specified operating temperature. Thus, by appropriately designing the electrical resistance for a target operating temperature, both the electromigration behavior and the electrical performance may be enhanced.

13 Claims, 3 Drawing Sheets

TECHNIQUE FOR FORMING METAL LINES IN A SEMICONDUCTOR BY ADAPTING THE TEMPERATURE DEPENDENCE OF THE LINE RESISTANCE

BACKGROUND OF THE INVENTION

1. Field of the Invention

Generally, the present disclosure relates to microstructures, such as advanced integrated circuits, and, more particularly, to fabricating conductive structures, such as copper-based interconnect lines, and techniques to enhance their overall performance by, for instance, reducing the electromigration and/or reducing the effective line resistance.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines may also have to be reduced to compensate for a reduced amount of available floor space and for an increased number of circuit elements provided per unit die area, as typically the number of interconnections required increases more rapidly than the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines.

Advanced integrated circuits, including transistor elements having a critical dimension of 0.13 μm and even less, may, therefore, require significantly increased current densities of up to several kA per cm$^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced material flow in metal lines and vias, also referred to as "electromigration," which may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.18 μm or less, may require significantly reduced cross-sectional areas of the metal lines and, thus, increased current densities, which may render aluminum less attractive for the formation of metallization layers.

Consequently, aluminum is being replaced by copper, a material with significantly lower resistivity and improved resistance to electromigration even at considerably higher current densities compared to aluminum. The introduction of copper into the fabrication of microstructures and integrated circuits comes along with a plurality of problems residing in copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is formed to separate the bulk copper from the surrounding dielectric material, and only a thin silicon nitride or silicon carbide or silicon carbon nitride layer in the form of a capping layer is frequently used in copper-based metallization layers. Currently, tantalum, titanium, tungsten and their compounds, with nitrogen and silicon and the like, are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less, in combination with trenches having a width ranging from 0.1 μm to several μm. Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure so as to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in view of electromigration, in order to find new materials and process strategies for forming metal lines and vias. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One failure mechanism, which is believed to significantly contribute to a premature device failure, is the electromigration-induced material transport, particularly along an interface formed between the copper and a dielectric capping layer acting as an etch stop layer during the formation of vias in the interlayer dielectric. Frequently used materials are, for example, silicon nitride and silicon carbon nitride, which exhibit a moderately high etch selectivity to typically employed interlayer dielectrics, such as silicon dioxide and a plurality of low-k dielectric materials, and also suppress the diffusion of copper onto the interlayer dielectric. Recent research results seem to indicate, however, that the interface formed between the copper and the etch stop layer is a major diffusion path for material transport during operation of the metal interconnect.

For state-of-the-art copper interconnect structures, the number and the strength of the bondings between the copper and the material of the etch stop layer is less compared to the strength and number of bondings formed between the copper and the conductive barrier layer, which covers the sidewalls and the bottom face of the metal interconnect. Consequently, the activation energy required for causing a stress-induced material transport, for instance, in the form of electromigration, seems to be lowest at the interface between the etch stop layer and the copper for state-of-the-art copper interconnect structures, thereby rendering this interface the main cause for premature interconnect failure and reduced reliability. Therefore, great efforts have been made in developing new techniques that strengthen this interface so as to increase the resistance against electromigration. For instance, it has been suggested to form a copper alloy to increase copper's resistance to electromigration as it has been recognized that the introduction of foreign atoms may result in a reduced current-induced mass flow. However, this strategy may contribute to an increased total electrical resistance of the copper line due to the presence of a moderate amount of copper alloy, which has a significantly higher electrical resistivity compared to pure copper.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to semiconductor devices and methods for forming the same, in which a metallization structure may be formed on the basis of a metal that is modified so as to obtain enhanced performance of the respective material features in view of electromigration and/or electrical resistance when operating the corresponding semiconductor device. To this end, the respective metal material characteristics may be selected on the basis of a target operating temperature for the metallization structure under consideration, thereby providing the potential for enhancing the electromigration behavior of respective metal features by incorporating a desired additional atomic species while not unduly increasing the respective electrical resistance at the target operating temperature. In other cases, the overall performance of respective metal features may be enhanced by appropriately adapting the characteristics of highly conductive metals, such as copper, silver and the like, so as to obtain a reduced resistance value at the target operating temperature with a moderately increased resistance at room temperature by significantly reducing the temperature dependence on the basis of appropriate modification techniques applied to a highly conductive base metal material, such as copper, prior to, during or after forming the respective metal features. Consequently, the lifetime of metallization structures of a given technology node may be increased and/or the performance thereof may be enhanced substantially without adding to additional process complexity.

One illustrative method disclosed herein comprises determining a target operating temperature for a metallization structure of a semiconductor device and selecting a base metal for forming metal features of the metallization structure. Furthermore, the method comprises determining a modification technique for modifying the base metal to obtain a modified base metal, wherein the intrinsic electric resistance of modified base metal exhibits a reduced temperature dependency and has an electric resistance value at the target operating temperature that is equal to or less than an electric resistance value of non-modified base metal at the target operating temperature. Finally, the metallization structure is formed on one or more substrates using the modification technique.

Another illustrative method disclosed herein comprises providing a substrate for forming thereon a metallization structure of a semiconductor device. Furthermore, a base metal material having a first resistance value at a first temperature and a second resistance value at a target operating temperature of the metallization structure is provided, wherein the first temperature is less than the operating temperature. The method further comprises modifying at least a portion of the base metal material to obtain a modified metal material having a higher resistance value at the first temperature and a lower resistance value at the target operating temperature compared to the base metal material. Furthermore, a metal feature of the metallization structure is formed on the basis of modified metal material.

An illustrative semiconductor device disclosed herein comprises a substrate and a metallization structure including a metal feature. The metal feature contains a copper base material and at least one further species distributed in at least a portion of the copper base material, wherein the portion has a higher resistance value at a first temperature and a lower resistance value at a target operating temperature of the metallization structure compared to substantially pure copper material.

BRIEF DESCRIPTION OF THE DRAWINGS

The disclosure may be understood by reference to the following description taken in conjunction with the accompanying drawings, in which like reference numerals identify like elements, and in which.

Figure 1A:
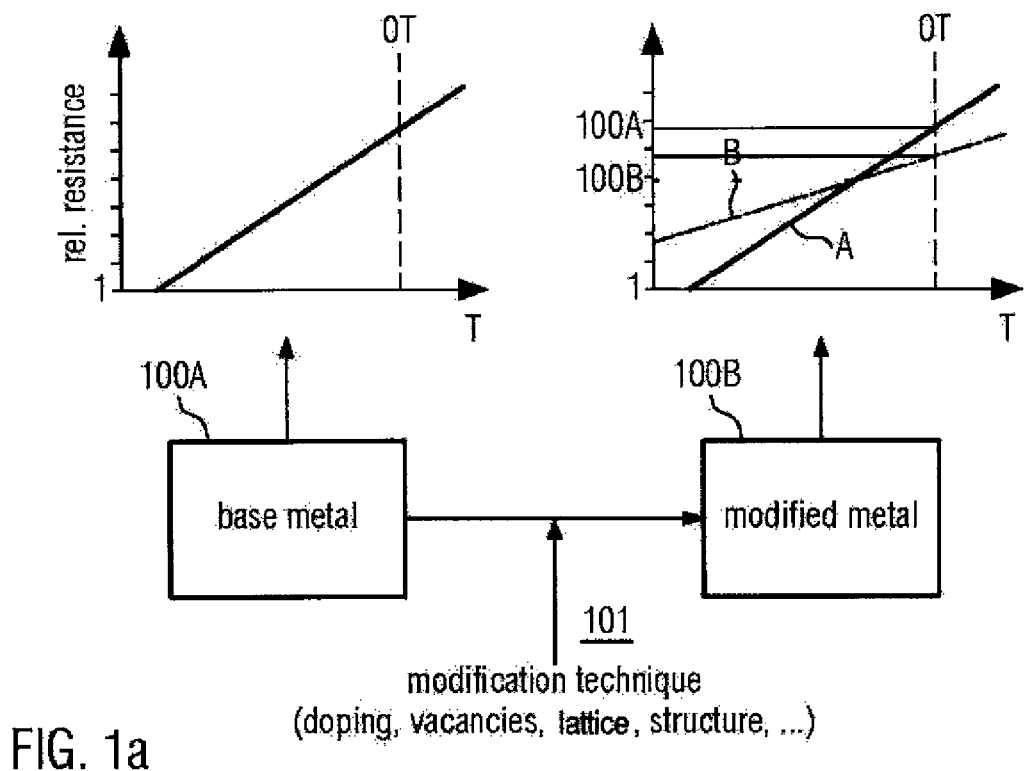
FIG. 1a schematically illustrates a strategy for determining an appropriate modification technique for providing a modified highly conductive metal material having enhanced performance with respect to electromigration and/or electrical resistance during operation of a respective semiconductor device, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein generally relates to sophisticated metallization structures including highly conductive metal materials, such as copper, silver, aluminum and the like, which are used to form metal features, such as lines, vias and the like, wherein increased current densities may typically occur during the operation of the respective semiconductor device. In this case, the overall performance, for instance, with respect to lifetime of the semiconductor device, operating speed and the like, may be substantially affected by the stress-induced mass flow in the metal features and/or by the overall electrical resistance. In this respect, it may be noted that the temperature dependency of the electrical resistance of metal features in semiconductor devices may be taken into consideration when evaluating the properties of a respective metal material with respect to the overall performance of metallization structures. As is well known, the electrical resistance of metals typically increases with increasing temperature, that is, at an operating temperature which may, for instance, be approximately 100° C. in the metallization level for sophisticated semiconductor devices, the electrical resistance of the highly conductive metal, such as copper, may be significantly higher compared to room temperature at which the manufacturing sequence and most of the electrical tests are performed. The electrical resistance of metal features is substantially determined by two contributions, the first of which is a phonon-related part, which describes the interaction of lattice vibrations with the free electrons in the metal crystal. A second part relates to the scattering events caused by any lattice defects of the base metal lattice. Thus, according to Matthiesen's rule, the total resistance rho is:

$$rho = rho_{phonon} + rho_{defect}$$

The phonon-related part significantly depends on the temperature, due to the fact that lattice vibrations increase with increasing temperature, while the defect-related part may only be weakly dependent on the temperature. Furthermore, it is well known that the temperature dependency of the phonon-related resistance is less pronounced when the crystalline configuration of the respective base metal material is modified, for instance, by introduction of defects. Typically, the additional introduction of lattice defects results in a lower temperature coefficient for the electrical resistance. In illustrative embodiments of the present disclosure, the effect of a reduced temperature dependency of the phonon-related part may be used to modify a corresponding highly conductive base material, such as copper, silver and the like, in order to "over-compensate" for the phonon-related part at a respective target operating temperature compared to a substantially pure metal base material, which may have a lower resistance at room temperature compared to a correspondingly modified metal material, which, however, may not significantly affect the overall performance of the respective metallization structure. Thus, by appropriately increasing the defect-related part of the overall electrical resistance in favor of a reduced phonon-related part due to the above-described mechanism, the electrical performance of respective metal regions in sophisticated metallization structures may be enhanced at the operating temperature.

Furthermore, it has been recognized that the electromigration endurance may be substantially improved by introducing impurities into the lattice of the metal material of interconnect lines. For instance, this has experimentally been demonstrated for aluminum-based metal lines in which copper has been incorporated, thereby enhancing the reliability of aluminum-based metallization structures. For sophisticated copper-based metallization structures, it has been demonstrated that additional aluminum in copper-based interconnect lines may result in an increased electromigration performance. For instance, in "Investigation of the Influence of the Local Microstructure of Copper Interconnects on Void Formation and Evolution During Electromigration Testing," by Meyer et al., AIP Conference Proceedings 817(1), 175-184, respective experimental data are provided. However, in these conventional approaches, the respective impurities incorporated into the highly conductive base material, such as copper or aluminum, result in a significantly higher resistivity, thereby reducing the overall performance of the respective metallization structure.

In illustrative embodiments disclosed herein, the additional introduction of impurities may be performed in such a way that an efficient reduction of the phonon-related part of the overall electrical resistance may be obtained, as explained above, while not unduly increasing the defect-related part, which may, in conventional strategies, result in the observed significant resistance increase, which may offset the advantages obtained with the enhanced electromigration behavior. Consequently, by moderately increasing the defect rate, for instance, by the introduction of appropriate impurity species, only a tolerable increase of the defect-related part of the electrical resistance may be obtained, which may result in an increased overall electrical resistance at lower temperatures, such as room temperature, while the effect of reducing the temperature dependence of the phonon-related part by the additionally added defects may compensate for or even overcompensate for the contribution of the phonon-related part to the temperature dependency of the overall resistance, thereby obtaining a similar electrical resistance or even a reduced electrical resistance at the operating temperature, while nevertheless providing the enhanced electromigration behavior due to the additional impurities. In this case, both the electromigration behavior and the line resistance at the operating temperature may be enhanced.

It should be appreciated that the principles disclosed herein may be advantageously applied to sophisticated semiconductor devices requiring metallization structures with metal lines and vias having lateral dimensions of 100 nm and less, since here the high integration density in the device level of the semiconductor device, in combination with increased static and dynamic leakage currents together with reduced cross-sectional areas of the respective metal features, may result in significant current densities, as previously explained. Hence, based on the subject matter disclosed herein, the respective performance of metallization structures may be increased on the basis of given design rules without substantially adding additional process complexity. However, the principles disclosed herein may also be applied to less critical applications in order to increase performance and reliability of corresponding semiconductor devices. For instance, well-established aluminum-based semiconductor devices may be fabricated on the basis of the subject matter disclosed herein, thereby providing the potential for increasing the reliability for a given circuit layout and/or reducing the size of the respective semiconductor device while maintaining reliability and performance despite a reduction of lateral dimensions of the respective metallization features. Consequently, unless specifically pointed out in the appended claims or the specification, the scope of the present disclosure should not be considered as being restricted to specific device dimensions and a specific metal material.

FIG. 1a schematically illustrates a strategy for determining appropriate material characteristics for a highly conductive metal to be used in sophisticated metallization structures of semiconductor devices. The respective desired material characteristics may be obtained by appropriately modifying the characteristics of a base metal, such as copper, silver, aluminum and the like, to reduce the temperature dependency of the electrical resistance of the modified base material, wherein the corresponding modification technique is adjusted or controlled in such a way that the electrical resistance of the modified metal material at a target operating temperature is comparable to or less than the electrical resistance of the base metal. That is, typically, a substantially pure form of the base metal may be used in an appropriate crystalline structure in an attempt to reduce the overall resistance of the corresponding material. However, as previously explained, the slope of the resistance versus temperature curve of the corresponding highly pure metal material may be substantially determined by the phonon-related part due to the moderately low defect-related portion of the overall resistance. For example, block 100A in FIG. 1a may represent a substantially pure highly conductive metal, such as copper, aluminum, silver and the like, that may be provided in a respective crystalline configuration, that is, the respective material may comprise a reduced number of crystalline defects, such as grain boundaries and the like. For this base metal, a corresponding temperature dependency of the overall resistance may be obtained, as is schematically illustrated in the plot located above block 100A. The horizontal axis represents the temperature of the metal material, wherein a target operating temperature (OT) is indicated. The operating temperature (OT) may be selected on the basis of respective experimental data or respective simulations, in which the corresponding temperature at different device levels and device regions may be obtained. It should be appreciated that the respective target operating temperature (OT) may therefore vary within a single semiconductor device, for instance, between respective metallization levels, wherein, for instance, lower lying metallization levels may be operated at higher temperatures compared to the higher metallization levels due to the significantly higher temperature at the device level of sophisticated semiconductor devices. It is to be noted that a respective resistance versus temperature dependency data may be established on the basis of metallization structures having similar or the same configuration as actual metallization structures of semiconductor devices so as to take into consideration respective influences caused by the various manufacturing steps involved in the fabrication of sophisticated metallization structures, as will be described later on in more detail.

Block 100B may represent a modified metal, which may substantially correspond to the base metal illustrated in the block 100A, except for a certain degree of modifications produced in order to appropriately change the resistance versus temperature dependency in such a manner that the electrical performance at the operating temperature (OT) and/or the electromigration endurance may be enhanced, as is previously described. For instance, a respective temperature dependence is schematically illustrated in the corresponding plot located above block 100B, wherein curve A represents the corresponding temperature dependence of the resistance of the base metal as represented by block 100A and also shown in the related graph, while curve B represents the corresponding behavior of the modified metal material. As is indicated in the corresponding graph, the resistance corresponding to the material 100B at the operating temperature (OT) may be less compared to the material 100A, since the corresponding defect-related part of the overall resistance may have been increased in a moderate manner so as to reduce the slope of the respective relationship. Thus, the material 100B may exhibit a higher resistance at lower temperatures, such as room temperature, compared to the material 100A, which may not substantially negatively affect the operational performance.

In order to obtain the desired resistance versus temperature behavior, an appropriate modification process or technique 101 may be used in order to provide the modified metal 100B based on the base metal 100A. It should be appreciated that the base metal 100A may not necessarily be the "start" material for the modification technique 101, but the modified metal 100B may be directly formed by any appropriate process technique once appropriate process parameters are determined. For example, the modified metal 100B may be provided in the form of an appropriately designed alloy that may be formed on the basis of any appropriate deposition technique without actually first providing the base metal and subsequently incorporating the alloy forming species into the base metal. Thus, the term "modification technique or process" with respect to the provision of a modified metal obtained based on a "base metal" is to be understood as including a manufacturing process for forming the modified metal, irrespective of whether the base metal is actually provided first and is then treated in a subsequent process sequence, or the modified metal is directly formed in a process sequence in which the corresponding features and components of the device may be fabricated.

The modification technique 101 may include, in some illustrative embodiments, the incorporation of an appropriate atomic species or a plurality of atomic species so as to form an alloy, such as a binary, ternary or even a higher order alloy, with an appropriate ratio of atoms of the base metal, such as copper, aluminum, silver and the like, and the additional alloy forming atomic species. An appropriate concentration of further atomic species may be determined on the basis of electrical test measurements, as will be explained later on, so as to obtain the desired resistance versus temperature behavior, as is, for instance, schematically represented by curve B. Thus, contrary to conventional strategies in which alloys may be formed in a highly conductive base metal, such as copper, without relating to the resistance at the operating temperature in order to enhance the electromigration behavior, thereby also increasing the overall electrical resistance of the alloy at the operating temperature (OT), due to moderately high concentrations of the alloy forming components, in the embodiments disclosed herein, the respective resistance at the operating temperature is determined and used as a criterion for estimating an appropriate dopant concentration or for determining an appropriate modification technique 101. Thus, a respective enhancement with respect to the electromigration endurance may be achieved without reducing or even enhancing the electrical performance of the respective metallization structure.

In other illustrative embodiments, respective defects may, in addition or alternatively to incorporating respective alloy-forming components or other dopants, be generated by creating vacancies in the respective structure of the base metal 100A. For instance, the base metal 100A having a high crystalline ordering may be appropriately treated, for instance, by bombarding the material with particles, such as ions and the like, in order to create a respective amount of vacancies in the crystalline structure. In other cases, the base metal 100A may first be formed in a pre-form so as to exhibit a moderately low crystalline order, which may then be enhanced by performing appropriate modification processes, such as annealing and the like, wherein the respective process parameters may be appropriately selected so as to maintain a specific amount of vacancies or other crystalline defects in order to obtain the desired resistance versus temperature behavior. In other cases, the lattice structure of the base metal 100A may be locally modified or changed, thereby creating respective lattice mismatched zones, which may then act as appropriate defects for increasing the defect-related part of the overall resistance, as previously explained.

Figure 1B:
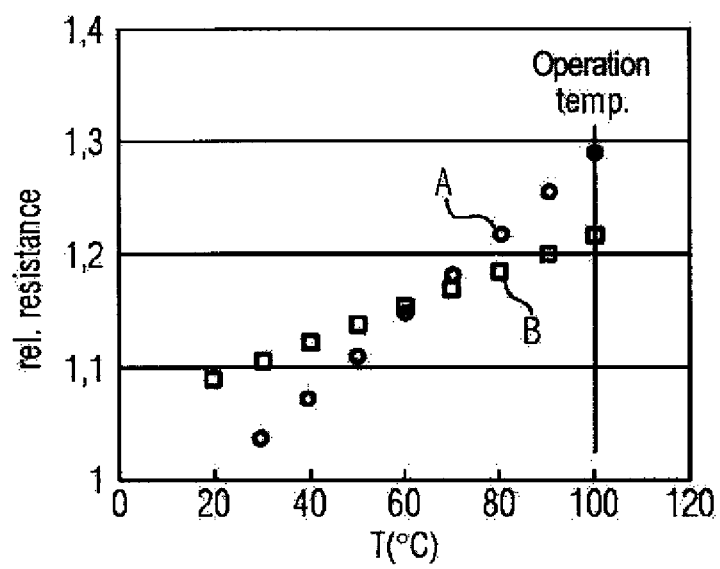
FIG. 1b schematically illustrates a graph for comparing the temperature dependency of the electrical resistance of a highly conductive copper and a modified copper, according to an illustrative embodiment.

FIG. 1*b* schematically illustrates a graphical representation of the resistance versus temperature behavior of copper for a target operating temperature of 100° C. As shown, curve A may represent the respective behavior for a substantially non-modified or pure copper material, which may be subjected to a specified manufacturing sequence for forming metal lines in sophisticated metallization structures. That is, a copper material represented by curve A may exhibit a specified crystalline structure, for instance, defined by the size of respective grains and the respective surface orientation thereof, while a moderately low amount of foreign atomic species or impurities may be incorporated into the copper due to process-related imperfections and the like. In the representation shown, the vertical axis may represent the relative resistance which is normalized to the resistance at 20° C. for curve A, whereas the horizontal axis represents the temperature. As is evident from FIG. 1*b*, at a target operating temperature of 100° C. the resistance of the substantially pure copper material may increase by about 28% due to the high contribution of the phonon-related portion of the entire electrical resistance, as previously explained. Curve B may represent a modified copper material, which may, for instance, include a certain amount of impurities, such as cobalt, aluminum, silver and the like. As indicated, the corresponding concentration of the impurities is maintained at a moderately low level so as to obtain a reduced electrical resistance at the operating temperature, while the corresponding increase of resistance at room temperature may be about 10% compared to the non-modified copper material. Consequently, a corresponding metallization structure formed on the basis of the modified copper material represented by curve B may have a reduced resistance of about 6% compared to a highly pure copper line, thereby correspondingly enhancing the conductivity and thus the electrical performance of the corresponding metallization structure. On the other hand, the respective amount of impurities introduced into the copper base material may nevertheless provide increased endurance and thus reliability due to the enhanced electromigration performance. It should be appreciated that a corresponding amount of impurities may significantly depend on the specifics of the overall manufacturing process sequence for forming the metallization structure, and therefore an appropriate concentration may be efficiently determined on the basis of respective experimental data representing the resistance versus temperature behavior of the temperature range of interest. For example, in some cases, a concentration of aluminum within a copper base material of approximately 0.1 atomic percent and less may result in the desired temperature behavior of the electrical resistance of the modified copper material.

Figure 1C:
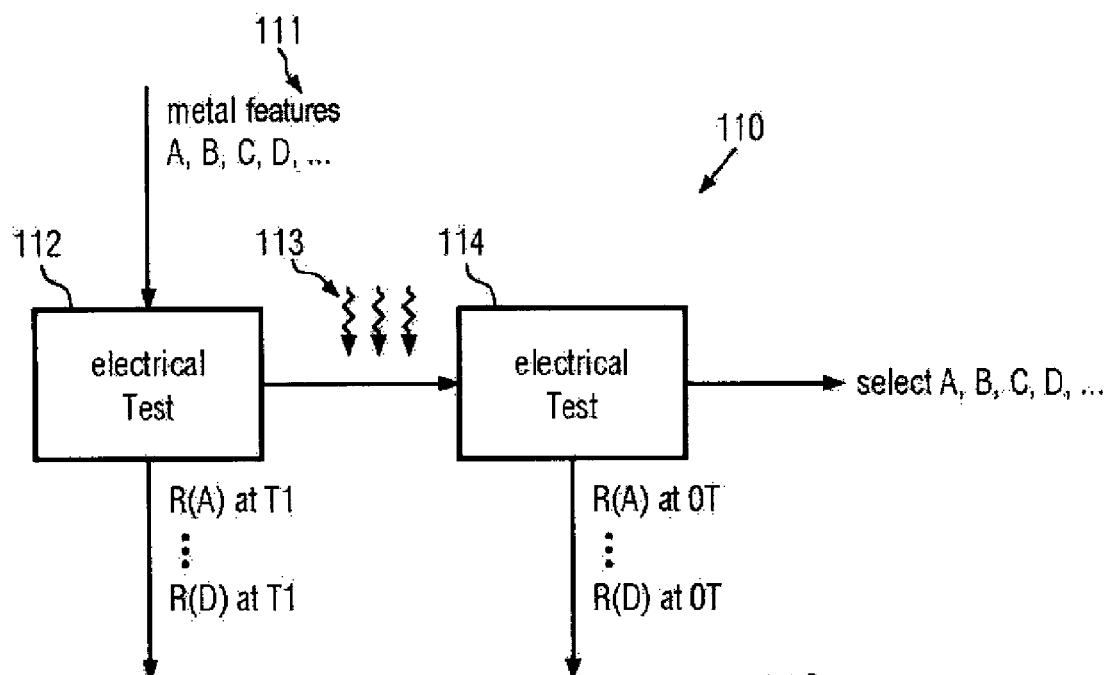
FIG. 1c schematically illustrates a process flow for determining one or more appropriate parameters for modifying a highly conductive base metal material on the basis of electrical test data obtained at two different temperatures, according to further illustrative embodiments.

FIG. 1*c* schematically illustrates a process flow 110 for determining appropriate electrical test data for evaluating and/or determining and/or controlling a respective process for providing a modified highly conductive metal material for forming metallization structures of sophisticated integrated circuits. In step 111 of the flow 110, a plurality of metal features may be provided, wherein at least some of the respective metal features, indicated as A, B, C, D, . . . may be formed such that a corresponding highly conductive material may differ in at least one characteristic that may substantially influence the defect-related portion of the overall electrical resistance, as previously explained. For instance, the metal features A may be formed on the basis of a modified copper material including a specified amount of impurity atoms so as to enhance the electromigration behavior while nevertheless maintaining the electrical resistance at a specified operating temperature OT at a similar value or at a lower value compared to a substantially pure copper material, i.e., a copper material in which the respective impurity atoms may not be present or may be present with a significantly reduced concentration. Similarly, the metal features B may be formed on the basis of substantially the same process sequence as the features A wherein, however, a different amount of the impurity species may be incorporated. Respective criteria may also apply for the further metal features C, D and the like. In other cases, some of the metal features A, B, C, D, . . . may differ in other characteristics, such as specifics of the corresponding manufacturing sequence, so as to appropriately modify the resistance characteristics of the copper base material, as previously explained. For instance, the crystallinity of some of the metal features may be designed differently in order to estimate the influence of the respective defects and to determine an appropriate defect rate and/or manufacturing sequence. Thus, a respective number of metal features may be provided for each parameter of interest in order to obtain a quantitative estimation with respect to the influence on the temperature behavior of the corresponding metal features.

The metal features A, B, C, D, . . . may be provided on one or more substrates, such as dedicated test substrates, or may be formed on respective test sites of actual product substrates, if the corresponding variation of the degree of modification may be compatible with the process steps performed on the actual device regions of the substrates. For example, different characteristics may be obtained for the various metal features A, B, C, D, . . . by locally varying a corresponding treatment, such as heat treatments, introduction of respective species and the like, thereby enabling the provision of a plurality of different metal features on the same substrate. Next, in step 112, the metal features A, B, C, D, . . . may be subjected to an electrical test in order to determine appropriate data indicating the respective resistance of the metal features at least one temperature T1 that is different from a target operating temperature (OT). For example, temperature T1 may represent the environmental temperature as usually encountered in a clean room environment, that is, typically about 22° C. The electrical test data representing the resistance of the respective metal features at the temperature T1 indicated as R(A) at T1 . . . R(D) at T1, may be obtained by any appropriate measurement technique, for instance, by forcing a current through a dedicated portion of the metal features A, B, C, D, . . . and determining the respective voltage drop. However, any other appropriate measurement techniques, such as determining the sheet resistance on the basis of well-established four point measurement processes and the like may also be used. Thereafter, in step 113, a treatment 113 may be performed so as to change the temperature of the metal features A, B, C, D, . . . and maintain the metal features at a target operating temperature (OT), which may be determined on the basis of experimental data, simulation, design rules and the like. As previously discussed, the respective operating temperature (OT) may be selected differently for different metal features, metallization levels, semiconductor devices and the like. The treatment 113 may, for instance, represent a heat treatment so as to increase the temperature when the previous measurements have been performed at a lower temperature Ti. In other cases, the treatment 113 may include cooling the metal features A, B, C, D, . . . when the temperature T1 is higher than the corresponding target operating temperature (OT). Thereafter, in step 114, further electrical test data may be generated by determining the corresponding electrical resistance values R(A) at OT . . . R(D) at OT, which may be obtained in substantially the same manner as previously described with reference to the step 112. It should be appreciated that, if desired, a plurality of intermediate measurement data may be generated, as is for instance shown in FIG. 1b, so as to obtain a more detailed representation of resistance versus temperature behavior of the metal features A, B, C, D . . . . From the corresponding measurement data obtained in steps 112, 114, an appropriate manufacturing sequence and/or material composition and thus modification technique for a highly conductive base material, such as copper, may be selected wherein at least the resistance at the operating temperature (OT) is equal to or less compared to the respective resistance of a substantially non-modified material, as previously explained. Hence, the selected metal feature A, B, C, D, . . . and thus the corresponding modification technique, for instance the concentration of impurity atoms, the defect rate, the amount of alloy forming species and the like, may be selected such that the electrical resistance is equal to or less compared to an equivalent metal feature formed on the basis of a substantially non-modified material, i.e., formed on the basis of a material that may not have experienced the corresponding modification process in order to provide a substantially pure highly conductive material.

Once appropriate parameters have been determined, respective metal features may be formed on a plurality of substrates receiving sophisticated metallization structures of semiconductor devices. As previously explained, the corresponding determination of a modification technique, that is, of appropriate electrical characteristics of the highly conductive material with respect to its resistance versus temperature behavior, may be selected on the basis of various design criteria, such as the target operating temperature (OT), the metallization level under consideration, the type of semiconductor device, the desired resistance at a further specified temperature other than the target operating temperature (OT), and the like. For example, in some metallization levels, it may be advantageous to obtain as high an electromigration endurance as possible so that the corresponding electrical resistance at the target operating temperature (OT) may be nearly the same as for the non-modified material, while, in other illustrative embodiments, increased lifetime may not be the primary concern and hence enhanced electrical performance, i.e., reduced electrical resistance at the operating temperature for a given technology standard, may be desired.

It should be appreciated that obtaining the electrical test data R(A) at OT for actual product substrates may also provide additional information on the overall process flow for forming respective metallization structures and, in particular, for the respective manufacturing sequence for performing the respective modification or providing the desired material composition in order to obtain the desired temperature behavior. Consequently, these additional electrical test data obtained during step 114, possibly in combination with the test data obtained in step 112, may be used for evaluating and/or controlling a part of the respective process flow.

Figure 1D:
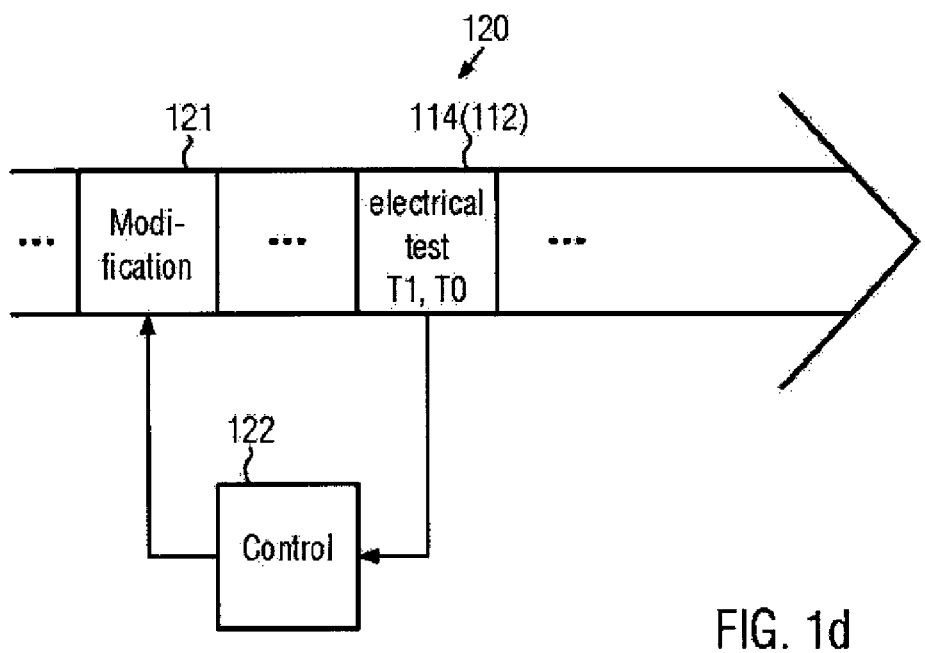
FIG. 1d schematically illustrates a process flow for forming a metallization structure including a modification process for incorporating a desired atomic species into a highly conductive metal and/or for reducing the electrical resistance at a target operating temperature, wherein a feedback control loop may be established, according to further illustrative embodiments.

FIG. 1d schematically illustrates a portion of a manufacturing sequence 120 for forming metallization structures of semiconductor devices, wherein, after the formation of respective metal features on the basis of a respective modification process 121, electrical test data may be obtained representing the electrical resistance at least at the corresponding target operating temperature (OT), such as the test data obtained in step 114, which may be supplied to a control system 122, which may determine the quality of the corresponding modification process 121 and which may, in some illustrative embodiments, determine an appropriate target process parameter value for readjusting the modification process 121, if the electrical test data obtained in step 114 indicate a deviation from the desired process output. For this purpose, any appropriate control strategy may be used, for instance, in the form of an efficient feedback control loop including a proportional and integral controller. In other cases, advanced process control strategies may be used so as to maintain a respective process output within a desired range. For instance, if a corresponding impurity species may be incorporated during the modification step 121, the corresponding process may be controlled so as to vary the respective concentration in order to obtain the desired resistance behavior. It should be appreciated that the electrical test data obtained in step 114, possibly in combination with the test data obtained in step 112, may further be used for evaluating a portion of or the entire process sequence for forming the respective metallization level under consideration, since a plurality of highly complex interrelated process steps, such as metal deposition, annealing the metal and the like, may contribute to the finally obtained overall electrical resistance.

Figure 2A:
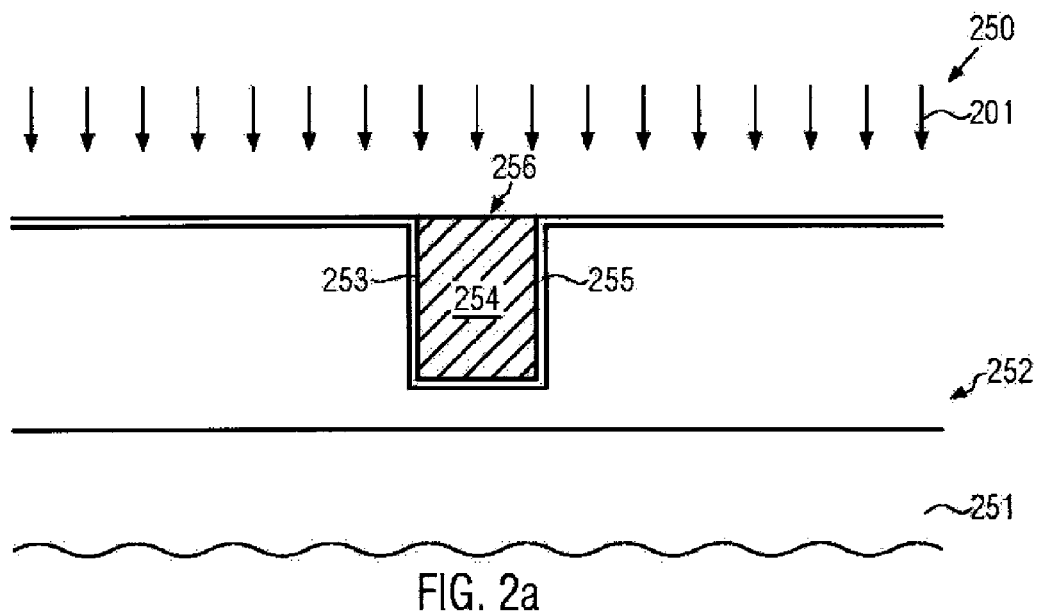
FIGS. 2a-2b schematically illustrate cross-sectional views of a semiconductor device including a metallization structure during various manufacturing stages, wherein a metal feature may be formed on the basis of a modified highly conductive base metal material, according to further illustrative embodiments.
Figure 2B:
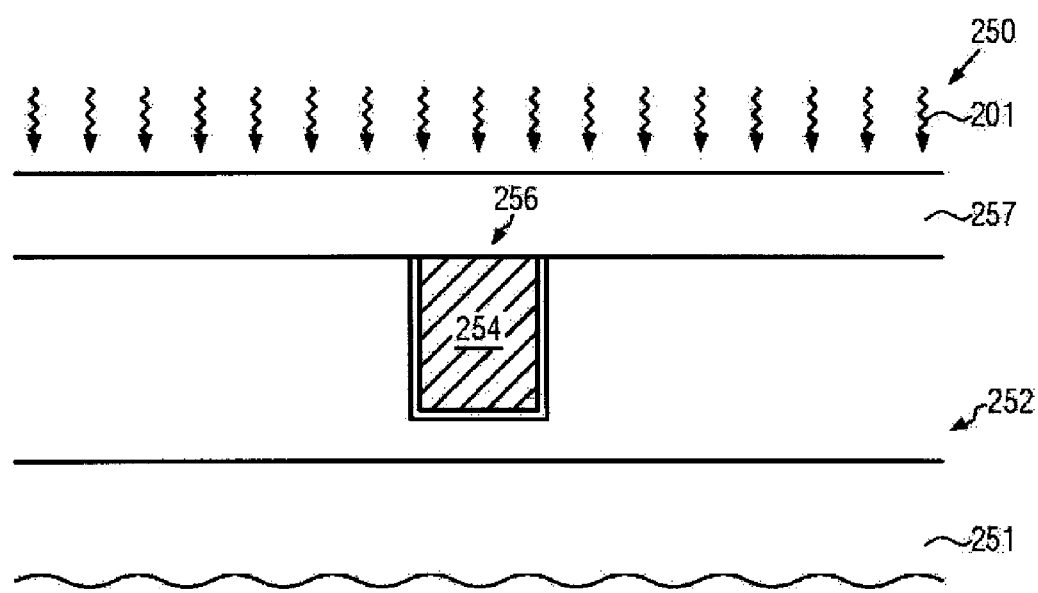

With reference to FIGS. 2a-2b further illustrative embodiments will now be described in which various manufacturing sequences including appropriate modification techniques may be used for forming a metal line in a metallization structure of a sophisticated integrated circuit.

FIG. 2a schematically illustrates a cross-sectional view of a semiconductor device 250 during a moderately advanced manufacturing stage. The semiconductor device 250 comprises a substrate 251, which may represent any substrate that is appropriate for forming semiconductor devices thereon. For instance, the substrate 251 may be a semiconductor substrate, an insulating substrate having formed thereon a crystalline semiconductor region, such as a crystalline silicon-based region, and the like. Typically, the substrate 251 may represent a carrier material having formed thereon a large number of circuit elements, such as transistors, capacitors, resistors and the like, as are required by the circuit layout of complex integrated circuits. These circuit elements may be electrically connected in accordance with the circuit design by means of one or more metallization layers, wherein, for convenience, the formation of a single metallization layer including a single metal line is described herein. It may, however, be readily appreciated that the concept of forming a modified metal base material in an interconnect line or via having the desired temperature dependency may be readily applied to any complex device configuration including a plurality of metallization layers and a large number of interconnect lines and vias. As previously indicated, if required, the corresponding adjustment of the temperature behavior of the respective metal material may be individually performed, depending on the respective criteria, such as target operating temperature and the like. The respective circuit elements should be considered as being included in the substrate 251. The semiconductor device 251 may further comprise a dielectric layer 252, also referred to as interlayer dielectric, which may be comprised of any appropriate material, such as silicon dioxide, silicon nitride, dielectric materials having a low dielectric constant, as is typically required in sophisticated semiconductor devices in order to reduce parasitic capacitance between neighboring metal lines. A trench 254 may be formed in the dielectric layer 252 with appropriate dimensions, i.e., a width, that is, the horizontal direction in FIG. 2a, a depth, i.e., the vertical direction, and a length, i.e., the dimension perpendicular to the drawing plane of FIG. 2a, in accordance with design requirements. Sidewall surfaces and a bottom surface of the trench 254 may be covered by a conductive barrier layer 255 comprising a material that significantly suppresses a diffusion of copper atoms into the dielectric layer 252 and also reduces the diffusion of unwanted components into a highly conductive metal material 253, which may represent copper in sophisticated applications. The trench 254 and the metal 253 may represent a metal feature 256, which, in combination with the dielectric layer 252, may represent a metallization structure of the device 250. For example, the barrier layer 255 may comprise tantalum, tantalum nitride, titanium, titanium nitride, tungsten, tungsten nitride, silicon, cobalt and combinations thereof. In one illustrative embodiment, the barrier layer 255 may comprise an appropriate dopant material for introducing appropriate impurity species into the base metal material 253. For instance, the layer 255 may comprise aluminum, cobalt, silver, magnesium and the like. The corresponding dopant material may be incorporated into the layer 255 or in specified portions thereof with an appropriate amount of approximately 1-10 atomic percent or higher, wherein the corresponding concentration may represent a local concentration in the barrier layer 255. That is, the corresponding concentration of up to approximately 10 atomic percent may represent the concentration at the interface between the material 253 and the barrier layer 255 so that these dopant species may be available for diffusion into the material 253 in a subsequently performed modification process 201.

A typical process flow for forming the semiconductor device 250 as shown in FIG. 2a may comprise the following processes.

After forming any circuit elements located in and above the substrate 251, the surface of the substrate 251 may be planarized, for instance, by providing a dielectric layer (not shown) and performing a chemical mechanical polishing (CMP) process. Thereafter, the dielectric layer 252, which may include an etch stop layer (not shown), may be formed by any appropriate technique, depending on the material composition and the structure required for the layer 252. For instance, silicon dioxide and certain low-k materials on the basis of silicon, carbon, oxygen, such as SiCOH, may be deposited by well-established plasma enhanced chemical vapor deposition (PECVD) techniques. Other low-k materials may require advanced spin-on techniques to form the layer 252 having the required thickness. Thereafter, the trench 254 may be formed by means of advanced and well-established photolithography and anisotropic etch techniques, wherein, depending on the process strategy, corresponding vias (not shown) may be formed prior to or after the formation of the trench 254. It should be appreciated that, in sophisticated applications, a width of the trench 254 may range from less than 100 nanometers in the first metallization level to several micrometers in upper metallization levels for sophisticated applications. Next, the barrier layer 255 may be formed.

In embodiments requiring the incorporation of a dopant material within at least the surface portion of the barrier layer 255, the deposition techniques used may correspondingly be modified so as to allow the incorporation of the desired dopant material. Thereafter, the base metal 253 may be filled into the trench 254 on the basis of established process techniques. For instance, the material 253 may be filled in by electrochemical deposition techniques, such as electroless deposition, electroplating and the like, wherein an appropriate seed layer may be formed prior to actually depositing the material 253. It should be appreciated that, in some illustrative embodiments, well-established techniques for providing a substantially pure copper material may be used wherein the desired degree of modification may be obtained during the process 201 so as to obtain the desired temperature behavior of the material 253, as previously explained. In this case, respective process recipes may be used without any significant modification. In other illustrative embodiments, the modification process 201 may represent a part of the deposition process for forming the material 253. That is, the corresponding deposition process may be modified so as to obtain a desired amount of impurity atoms within the material 253 during the deposition in order to obtain the desired concentration, wherein possibly further subsequent process steps of the modification process 201 may provide enhanced material uniformity or non-uniformity, depending on the device requirements. For instance, an appropriate precursor material may be introduced into the respective electrolyte solution or into a respective consumable electrode material, in order to obtain a desired concentration of one or more impurity species in the base material 253.

Next, any excess material of the base material 253 may be removed on the basis of appropriate techniques, such as electrochemical etching, chemical mechanical polishing (CMP) and the like. In some illustrative embodiments, the modification process 201 may include a corresponding treatment, such as a heat treatment, for instance, designed such that the crystallinity of the material 253 may also be adjusted to a desired configuration, thereby also initiating a respective diffusion of impurity atoms, if provided in the barrier layer 255. In this case, an enhanced concentration of respective impurity atoms may be obtained at the top surface of the material 253 due to the creation of respective grains, wherein the corresponding grain boundaries may provide efficient diffusion paths substantially without incorporating the corresponding impurity atoms in the interior of the respective grains. Consequently, in this way, a highly locally resolved provision of the impurity material at the top surface of the material 253 may be achieved since, here, typically a cap layer may be formed in a later manufacturing stage, which may conventionally represent a moderately weak interface giving rise to enhanced current-induced mass flow, which may be efficiently suppressed by providing respective impurity atoms. Furthermore, since the corresponding concentration may be selected on the basis of the principles as previously described, an increase in electrical resistance at the target operating temperature may be avoided or may even be reduced, thereby not unduly affecting the electrical performance or even improving the electrical performance of the metal feature 256. Similarly, any impurity species provided in the volume of the material 253 may, therefore, also contribute to a reduced electrical resistance at the operating temperature, thereby even further reducing the overall resistance during operation of the device 250.

In other illustrative embodiments, the modification process 201 may include a particle bombardment of the material 253, which may have been provided in the form of a substantially pure material, such as copper, thereby introducing a certain amount of impurity atoms in order to create a respective alloy or otherwise providing the desired number of defects, as previously described. In still other cases, the particle bombardment may be performed on the basis of a heavy atomic or ionic species so as to create high damage at a moderately low dose, so that a corresponding modification of the crystalline structure of the material 253 may be obtained, while not unduly affecting the surrounding material of the dielectric layer 252. The corresponding particle bombardment, for instance, an ion implantation process, may be performed after performing any treatment for adjusting the crystallinity of the material 253, for instance, on the basis of well-established conventional strategies, thereby creating the desired degree of lattice defects. Furthermore, the corresponding introduction of lattice defects may be restricted to a surface area of the material 253, when a highly local modification of the respective characteristics may be desired. For instance, the particle bombardment may be used to incorporate an appropriate impurity species in a locally restricted manner, thereby improving the electromigration characteristics at the interface to a further dielectric cap layer still to be formed above the metal feature 256.

FIG. 2b schematically illustrates the semiconductor device 250 according to further illustrative embodiments, in which the metal feature 256 may be formed on the basis of well-established conventional process strategies or on the basis of any of the process techniques described above with reference to FIG. 2a. Alternatively or in addition to the modification steps described with reference to FIG. 2a, the modification process 201 according to FIG. 2b may include a heat treatment, wherein an appropriate sacrificial layer or permanent layer 257 may be provided above the dielectric layer 252 and the metal feature 256, which may contain an appropriate dopant species, as previously explained. Consequently, during the treatment 201, a respective diffusion activity may be initialized in order to distribute the corresponding dopant species within the base metal material 253. With respect to appropriate dopant species, which may provide the desired defect density or alloy forming activity, the same criteria apply as previously explained with reference to FIG. 2a. In some illustrative embodiments, the treatment 201 may be performed at appropriate temperatures so as to substantially uniformly distribute the corresponding dopant species within the material 253 since respective grain boundaries may not yet be established within the material 253 or the diffusion temperature may be sufficient to also incorporate the respective dopant species into the interior of the corresponding grains. In other illustrative embodiments, the treatment 201 may be designed so as to also establish a desired crystallinity of the material 253, for instance, by treating or heating the metal feature 256 in a spatially restricted manner, for instance, by scanning a spot of increased temperature along the length direction of the metal line 256 so as to also establish crystal grains of increased size. During this process, a respective diffusion activity may also be achieved, thereby appropriately distributing the respective dopant species within the material 253. In other illustrative embodiments, the treatment 201 may include a respective sequence for adjusting the crystallinity of the material 253, for instance, by performing a corresponding locally restricted heat treatment, wherein a different crystalline structure may be locally generated, for instance, in an upper portion of the material 253 compared to a lower portion, thereby also creating a respective concentration of crystalline defects, which may result in a corresponding temperature behavior of the electrical resistance.

It should be appreciated that appropriate process conditions and parameter values for the respective modification processes 201 may be readily established on the basis of the concepts as previously described with reference to FIGS. 1a-1d. Consequently, gain in electrical performance and/or electromigration performance may be obtained for the metallization structure, i.e., a combination of the dielectric layer 252 and the metal feature 256, for a given technology node, substantially without adding process complexity compared to conventional strategies.

By moderately introducing defects into a highly conductive material, such as copper, the resistance versus temperature behavior may be significantly modified so that enhanced electromigration behavior and/or electrical performance may be obtained in metallization structures of advanced semiconductor devices. The defect-related portion of the resistance may be moderately increased so as to change the slope of the resistance versus temperature curve, thereby allowing the incorporation of impurity atoms for enhancing the electromigration endurance while not unduly increasing the overall resistance at the operating temperature or even reducing the corresponding resistance at the specified operating temperature. Thus, in some illustrative embodiments, by appropriately designing the electrical resistance for a target operating temperature, both the electromigration behavior and the electrical performance may be enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a substrate; and
   a metallization structure including a metal feature formed in a trench in a dielectric layer that is formed over the substrate, said metal feature containing a copper base material and at least one further species distributed in at least a portion of said copper base material, said portion having a higher resistance value, relative to substantially pure copper material, at a first temperature and a lower resistance value, relative to substantially pure copper material, at a target operating temperature of said metallization structure, wherein the target operating temperature is higher than the first temperature.

2. The semiconductor device of claim 1, wherein said portion forms an interface with the dielectric material.

3. The semiconductor device of claim 1, wherein said at least one further species is distributed within substantially the entire copper base material.

4. The semiconductor device of claim 1, wherein said at least one further species forms an alloy with said copper base metal.

5. The semiconductor device of claim 1, wherein said copper base metal comprises defects created in said copper base metal.

6. The semiconductor device of claim 5, wherein the defects in said copper base metal comprise vacancies generated in said base metal.

7. semiconductor device of claim 5, wherein the defects in the copper base metal comprise a different crystalline configuration created locally in the copper base metal.

8. A semiconductor device, comprising:
   a substrate; and
   a metallization structure including a metal feature formed in a trench in a dielectric layer that is formed over the substrate, said metal feature containing a copper base material and at least one further species distributed in at least a portion of said copper base material, wherein a temperature dependence of a resistance of the portion is modified by said at least one further species to increase less rapidly, relative to substantially pure copper material, with increasing temperature.

9. The semiconductor device of claim 8, wherein the resistance of the portion comprises a defect-related resistance, and wherein the defect-related resistance of the portion is increased, relative to a defect-related resistance of substantially pure copper material, by said at least one further species.

10. The semiconductor device of claim 9, wherein the resistance of the portion comprises a phonon-related resistance, wherein a temperature dependence of the phonon-related resistance of the portion is reduced by said at least one further species so that the phonon-related resistance of the portion increases less rapidly, relative to the phonon-related resistance of substantially pure copper material, with increasing temperature.

11. The semiconductor device of claim 8, wherein the resistance of the portion is larger than the resistance of substantially pure copper material at room temperature.

12. The semiconductor device of claim 11, wherein the resistance of the portion is smaller than the resistance of substantially pure copper material at an operating temperature that is higher than room temperature.

13. The semiconductor device of claim 12, wherein the resistance of the portion is smaller than the resistance of the substantially pure copper material at approximately 100° C.

* * * * *